(12) United States Patent
Achouche et al.

(10) Patent No.: US 9,214,582 B2
(45) Date of Patent: Dec. 15, 2015

(54) UNI-TRAVELLING-CARRIER PHOTODIODE

(75) Inventors: Mohand Achouche, Marcoussis (FR); Mourad Chtioui, Limours (FR)

(73) Assignee: Alcatel Lucent, Boulogne-Billancourt (FR)

( * ) Notice: Subject to any disclaimer, the term of this patent is extended or adjusted under 35 U.S.C. 154(b) by 131 days.

(21) Appl. No.: 13/991,963

(22) PCT Filed: Dec. 7, 2011

(86) PCT No.: PCT/EP2011/072096
§ 371 (c)(1),
(2), (4) Date: Nov. 4, 2013

(87) PCT Pub. No.: WO2012/080061
PCT Pub. Date: Jun. 21, 2012

(65) Prior Publication Data
US 2014/0042584 A1  Feb. 13, 2014

(30) Foreign Application Priority Data
Dec. 16, 2010 (EP) ................................ 10306423

(51) Int. Cl.
*H01L 31/0352* (2006.01)
*H01L 31/101* (2006.01)

(52) U.S. Cl.
CPC ...... *H01L 31/035272* (2013.01); *H01L 31/101* (2013.01)

(58) Field of Classification Search
CPC .............. H01L 31/101; H01L 31/0352; H01L 31/035272

USPC .......................................... 257/463, 428, 451
See application file for complete search history.

(56) References Cited

U.S. PATENT DOCUMENTS

| | | | | |
|---|---|---|---|---|
| 5,844,253 A | * | 12/1998 | Kim et al. | 257/24 |
| 6,043,549 A | * | 3/2000 | Gutierrez-Aitken | 257/458 |
| 6,795,622 B2 | | 9/2004 | Forrest et al. | |
| 7,343,061 B2 | | 3/2008 | Forrest et al. | |
| 2002/0105711 A1 | * | 8/2002 | Kaneko | 359/248 |
| 2004/0056250 A1 | * | 3/2004 | Wang et al. | 257/53 |
| 2005/0056861 A1 | * | 3/2005 | Ko et al. | 257/184 |

FOREIGN PATENT DOCUMENTS

| | | |
|---|---|---|
| CN | 1940612 A | 4/2007 |
| CN | 100474634 | 4/2009 |
| DE | 2725076 A1 | 12/1978 |
| JP | 09275224 A | 10/1997 |

(Continued)

OTHER PUBLICATIONS

D. Streit et al., "InP and GaAs Components for 40 GBPS Applications," IEEE GaAs Digest, XP-001046998, 2001, pp. 247-250.

(Continued)

*Primary Examiner* — Asok K Sarkar
*Assistant Examiner* — Dmitriy Yemelyanov
(74) *Attorney, Agent, or Firm* — Harness, Dickey & Pierce, P.L.C.

(57) ABSTRACT

A uni-travelling carrier photodiode includes an absorption region of p-type doped material. The photodiode further includes a first collector layer and second collector layer wherein the absorption region is located between the first collector layer and the second collector layer.

6 Claims, 4 Drawing Sheets

(56) References Cited

FOREIGN PATENT DOCUMENTS

| | | |
|---|---|---|
| JP | 2000164916 A | 6/2000 |
| JP | 2000164946 A | 6/2000 |
| TW | 200924177 A | 6/2009 |

OTHER PUBLICATIONS

Xin Wang et al., "InGaAs—InP Photodiodes with High Responsivity and High Saturation Power," *IEEE Photonics Technology Letters*, vol. 19, No. 16, Aug. 15, 2007, pp. 1272-1274.

Sergei Malyshev et al., "State of the Art High-Speed Photodetectors for Microwave Photonics Application," IEEE, May 17-19, 2004, pp. 765-775.

Andreas Beling et al., "InP-Based High-Speed Photodetectors," *Journal of Lightwave Technology*, vol. 27, No. 3, Feb. 1, 2009, pp. 343-355.

Dong-Hwan Jun et al., "Improved Efficiency-Bandwidth Product of Modified Uni-Traveling Carrier Photodiode Structures Using an Undoped Photo-Absorption Layer," *Japanese Journal of Applied Physics*, vol. 45, No. 4B, 2006, pp. 3475-3478.

Office Action for corresponding Japanese Application No. 2013-543649 dated May 20, 2014 and English translation thereof.

International Search Report PCT/ISA/210 for PCT/EP2011/072096 dated Mar. 8, 2012.

Taiwan IPO Search Report for corresponding Taiwan Patent Application No. 100145760.

* cited by examiner

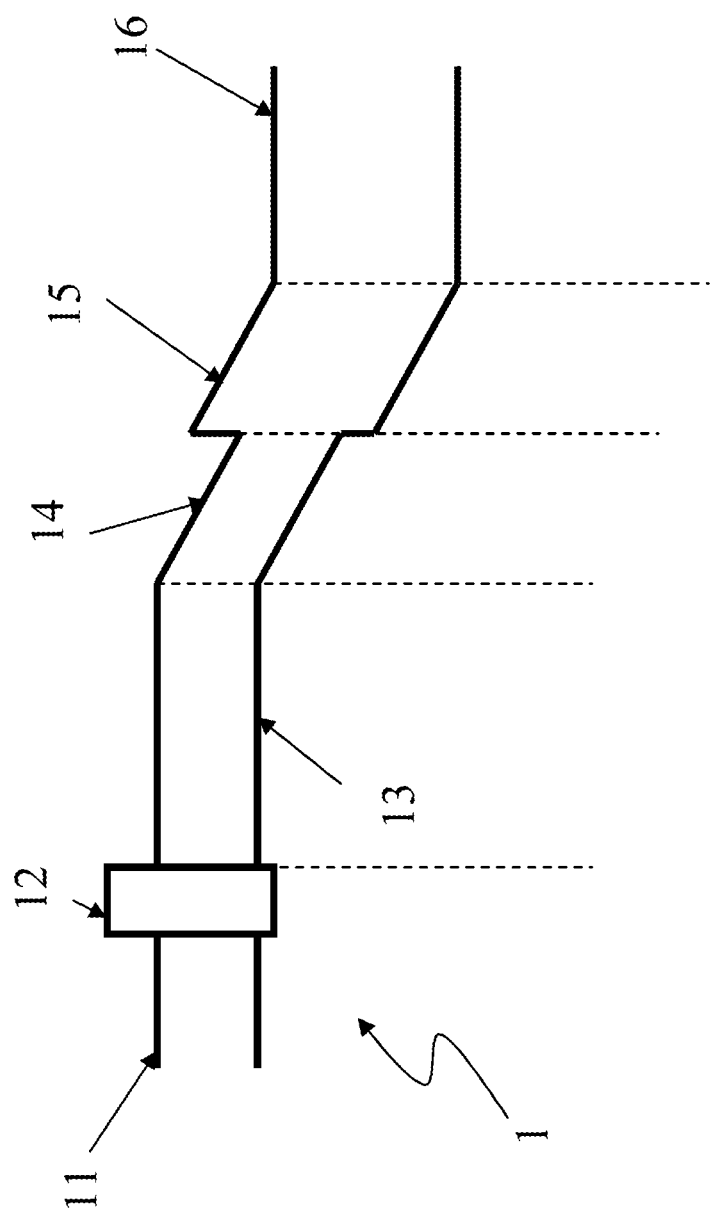

UNI-TRAVELLING-CARRIER PHOTODIODE

This application is the national phase under 35 U.S.C. §371 of PCT International Application No. PCT/EP2011/072096 which has an International filing date of Dec. 7, 2011, which claims priority to European patent application number 10306423.4 filed Dec. 16, 2010; the entire contents of each of which are hereby incorporated by reference.

The present invention relates to optical components. In particular the invention relates to photodiodes.

BACKGROUND ART

Uni-travelling-carrier (UTC) photodiodes are typically used in high speed optical telecommunication systems. Such devices typically operate based on converting an incoming light to electricity. A UTC typically comprises a p-doped absorption region in which incident photons are absorbed and generate free carriers (electrons and holes). This absorption layer is typically followed by a lightly doped transparent layer called collector. As photons absorption typically takes place in a p-doped layer, holes are majority carriers and only electrons are typically the active carriers. The photo-generated electrons diffuse through the p-doped region and reach the depleted collector region. By applying a reverse bias voltage to said collector region, electrons may be further accelerated and collected in an n-doped region. Thus creating a reverse current which is typically proportional to the incident optical power.

Since only electrons are used as active carriers, the UTCs typically can reach a higher speed and a higher saturation current as compared to conventional PIN photodiodes where both holes and electrons transit in a depleted region.

SUMMARY

In a typical structure of a UTC, the absorption region is p-doped and the carrier drift layer (also known as depletion region) is typically made of a transparent wide bandgap material called collector. Even if the speed response of UTCs is typically improved as compared to devices such as conventional PIN detectors, there still remains a trade-off between bandwidth in which such devices operate and responsivity particularly for front- and back-side illuminated structures. In fact, a thick absorption region is typically needed to reach a high responsivity (efficiency) in such surface illuminated structures. However, for high speed operations, a thin absorption region is preferred since in a thick p-doped absorption region, electrons diffusion time may limit the device's response.

Within the context of the present description, the term responsivity refers to the efficiency of the device and it is given by the ratio of the detected current divided by the incident optical power. The terms response time refers to the time it takes for free electrons to travel (transit) from the absorption region where they have been generated to the collector of the device where they are collected and output from the device to further stages of the particular application. Such time is typically composed of the transit time in the p-type doped absorption region (often referred to as diffusion time) and the transit time in the collector region (often referred to as drift time).

FIG. 1 schematically shows an example of a band structure of a known UTC structure comprising some modifications with an aim to improve bandwidth-responsivity trade-off as compared to conventional UTC structures as described above. The structure 1 typically comprises a p-type contact layer 11 used for providing electrical contact, a highly doped p-type barrier layer 12 used for blocking the diffusion of electrons towards the p-type contact layer. An absorption region comprising a first layer 13 which is p-doped and a second layer 14 which is undoped (or depleted). The layers 13 and 14 of the absorption region are typically the layers where the charge carriers are generated after absorption of an incident light. The depleted layer 14 of the absorption region is typically used in order to contribute to the absorption of the incident light, and thus to increase the device responsivity without substantially increasing the electrons diffusion time in the p-doped absorption layer. In fact, under the effect of an electric field caused by the application of a reverse biased voltage, free charge carriers are accelerated in the depleted layer 14 of the absorption region in such a manner that free holes typically drift towards p-doped layers and free electrons typically drift towards the collector layer 15 comprising a depleted layer which is used for further accelerating free electrons. This second depleted layer (after the first deleted layer 14) contributes to reducing the junction capacitance by increasing the thickness of the total depleted region. Finally, the device comprises an n-doped contact layer 16 used for providing electrical contact.

Therefore, in such structure, the total absorption region (layers 13 and 14) may be thick enough to ensure a high responsivity without substantially limiting the device response-time. In such a device, by reducing the thickness of the p-doped layer 13 of the absorption region one may be able to improve the response time of the device by reducing the diffusion time of the generated electrons. However, the thickness of the depleted layer 14 of the absorption region is typically limited by the transit time of the photo-generated holes as such holes typically travel in a relatively slower speed as compared to photo-generated electrons. Also the space charge effects typically increases with holes generation in said depletion layer which may also limit the detector saturation current.

Some embodiments of the invention feature a uni-travelling carrier photodiode comprising an absorption region of p-type doped material wherein the photodiode further comprises a first collector layer and second collector layer wherein the absorption region is located between the first collector layer and the second collector layer.

According to some specific embodiments, the absorption region is configured to generate electrons in response to an absorption of an incident light wherein some electrons diffuse toward the first collector layer and some other electrons diffuse toward the second collector layer.

According to some specific embodiments a contact layer is made of p-type material, said contact layer being located within the absorption region.

According to some specific embodiments the absorption region comprises variation in a level of doping of the p-type material, such variation comprising a gradual p-doping configuration of said material.

According to some specific embodiments the p-type material of the absorption region comprises a gradual material composition with a uniform p-doping.

According to some specific embodiments the absorption region comprises a first p-doped sub-region, a second p-doped sub-region, a first depleted section being located between the first sub-region region and the first collector layer and a second depleted section being located between the second sub-region and the second collector layer.

Some embodiments relate to an optical equipment comprising a photodiode as featured herein.

These and further features and advantages of the present invention are described in more detail, for the purpose of illustration and not limitation, in the following description as well as in the claims with the aid of the accompanying drawings.

BRIEF DESCRIPTION OF THE DRAWINGS

FIG. 1, already described, is an exemplary schematic representation of a band structure of a known UTC structure.

FIG. 2b is an exemplary schematic representation of a cross-sectional view of the double collector UTC structure of FIG. 2a.

DETAILED DESCRIPTION

Figure 2A:
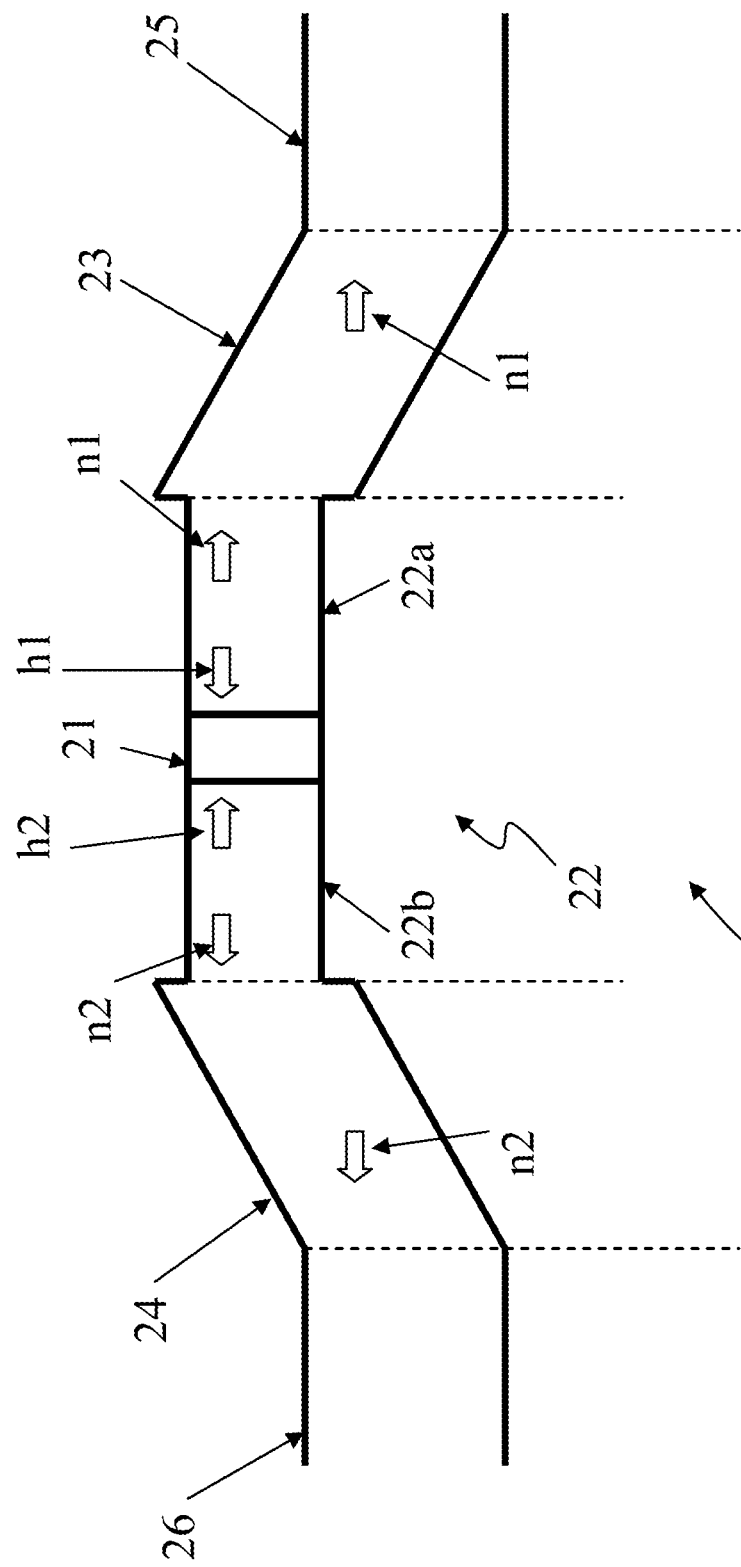
FIG. 2a is an exemplary schematic representation of a band structure of a double collector UTC structure according to some embodiments.
Figure 2B:
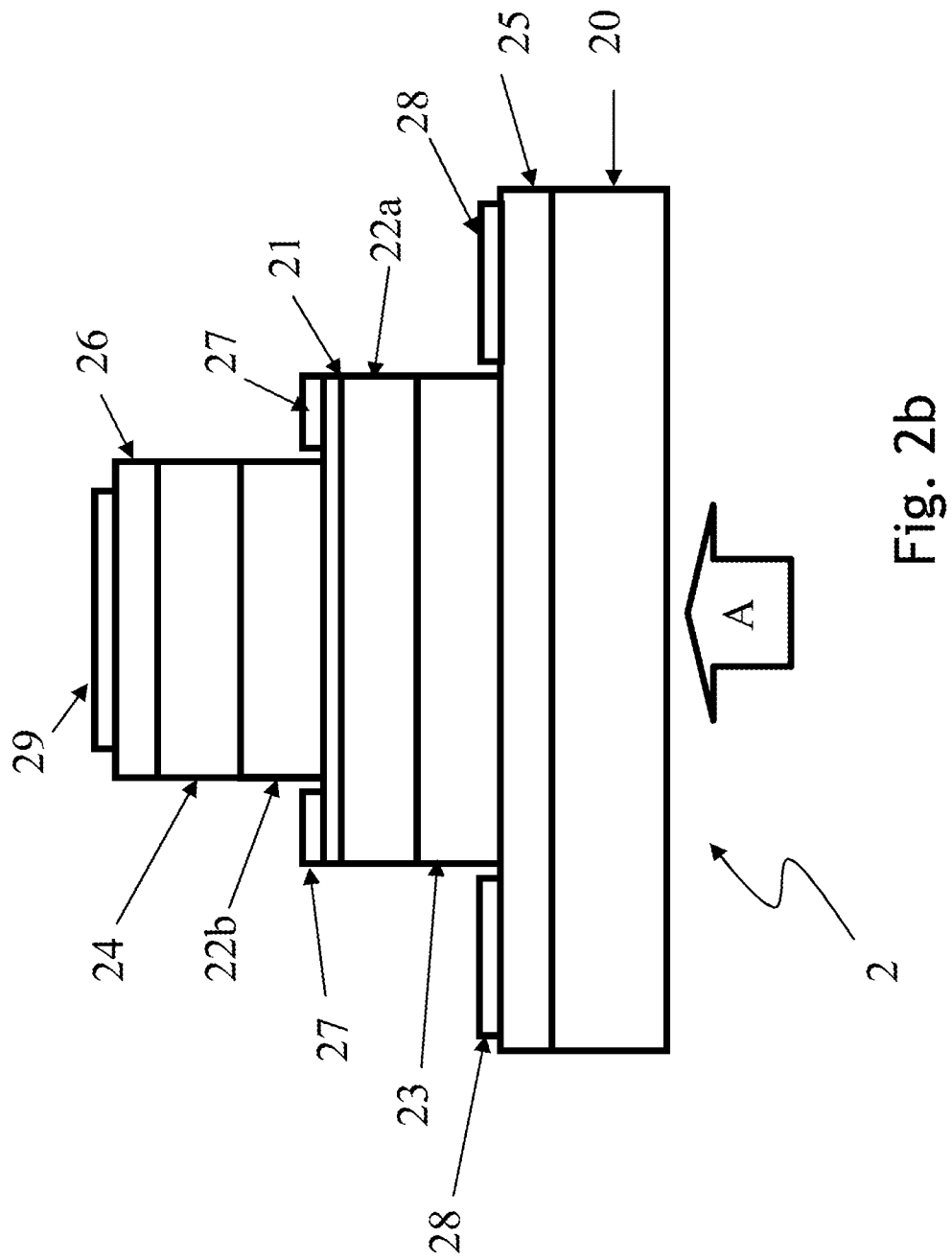

According to some embodiments a double collector UTC structure is proposed in order to improve responsivity-bandwidth trade-off. FIG. 2a is an exemplary schematic representation of a band structure of a double collector UTC structure according to such embodiments. FIG. 2b is a cross-sectional representation of the exemplary schematic representation of the structure shown in FIG. 2a. In FIG. 2b, like elements have been given like reference numerals as those of FIG. 2a.

One purpose of the proposed structure is to reduce carriers transit time in the absorption region and improve current saturation in the collector by distributing the photocurrent, namely the current caused by the movement of the electrons generated as a result of light absorption in the absorption region, towards two separate collectors.

With simultaneous reference to FIGS. 2a and 2b, the structure 2 comprises a p-type contact layer 21 used for providing electrical contact and an absorption region 22 where, upon receiving and absorbing an incident light, charge carriers may be generated. The absorption region 22 is preferably made of p-type material and is located between a first collector layer 23 and a second collector layer 24. As shown in the figures, the p-type contact layer 21 is located within the absorption region 22 and two sub-regions 22a and 22b of the absorption region 22 are shown on either side of the contact layer 21. The sub-regions 22a and 22b are respectively adjacent to first and the second collector layers 23 and 24 as shown in the figures. The first and the second collector layers are preferably made of lightly n-doped material.

The absorption layer 22 may be preferably made of any of the following materials GaInAs, GaInAsP, GaAsSb, Ge. The contact layer 21 may be preferably made of any of the following materials GaInAs, GaInAsP, InP, and the collector layers 23 and 24 may be preferably made of any of the following materials InP, GaInAsP, AlInAs.

The photodiode 2 further comprises a first n-doped contact layer 25 and a second n-doped contact layer 26. Preferably the first and second contact layers 25 and 26 are n-doped at a higher level than the level of doping of the first and second collector layers 23 and 24. Typical collector doping concentration values may be about $10^{16}$ cm$^{-3}$, and typical N contact layer doping values may be about $10^{18}$ cm$^{-3}$.

The structure of FIG. 2b is a back-side illumination configuration as shown by the arrow A representing the direction and the location of the incident light. However, this is not mandatory and other configurations such as front-side or lateral illumination may also be used within the scope of the present invention.

With further reference to FIG. 2b, the structure of the photodiode 2 may be made on a substrate 20 preferably made of InP material and further comprise contact points 27 for the contact layer 21 and contact points 28 and 29 for the first and the second contact layers 25 and 26 respectively.

The contact points 27, 28 and 29 may be for example metal contacts. With the above structure, the photodiode 2 of FIGS. 2a and 2b may operate in the following manner.

Assuming that a light beam A is incident on the device by back side illumination as shown in FIG. 2b, said light beam may propagate inside the photodiode 2 and reach the absorption region 22. In the absorption region, photons are absorbed and consequently charge carriers, electrons and holes, are generated (this phenomenon is often called photo-generation).

It is further assumed that a reverse bias voltage is applied to the photodiode, namely the p-type contact layer 21 is connected to the negative pole and the n-type contact layers 25 and 26 are connected to the positive pole of a voltage source. Photo-generated holes are attracted towards the negative pole, namely the p-type contact layer 21 as shown in FIG. 2a by means of arrows h1 and h2.

On the other hand, due to diffusion mechanisms in the p-doped absorption region and under the effect of the reverse bias voltage in the collector layers, electrons are attracted towards the positive poles namely the n-type contact layers 25 and 26 as shown in FIG. 2b by means of arrows n1 and n2 respectively. However, as there are two contact layers, 25 and 26, some electrons may tend to move toward one contact layer while others may tend to move toward the other contact layer.

This possibility of directing the electrons towards the first or the second contact layers, as proposed by the embodiments provided herein, enables the shortening of the diffusion distance of the electrons thereby improving the performance of the photodiode device, as compared to conventional photodiodes.

Therefore, the effective distance available for diffusion of electrons in the absorption region 22 according to the example of FIGS. 2a and 2b is on the average equivalent to the half of the an effective distance available for diffusion of electrons in the absorption region of a conventional UTC structure having a similar thickness for the absorption region. As it is known, the diffusion time constant is proportional to the square of the distance. Therefore by reducing the average available diffusion distance to half, an improvement by a factor of up to 4 of the diffusion time may be achieved in the absorption region compared to a conventional UTC structure. This improvement relaxes considerably the constraint that typically exists in relation to the design of absorption regions based on conventional structures. Thus, a relatively higher responsivity can be achieved by designing a relatively thick absorption region without substantially increasing the diffusion time. The improvement in diffusion time therefore may allow for the possibility of achieving simultaneously high bandwidth and high responsivity.

Preferably, the absorption region may be designed to have a variation in the level of doping of the p-type material of which it is made of. In such case, a gradual p-doping configuration along the length of the structure, from the contact layer 21 to the collector layer 24, may be applied.

Alternatively, the p-type material of the absorption region may comprise a gradual composition of materials having an uniform p-doping level. The terms gradual composition refer to a composition that stays lattice-matched to the InP substrate. As a non-limiting example, appropriate alloy that is lattice-matched to InP substrate is In(53%)Ga(47%)As. In order to have an internal potential to accelerate carriers, one method is to start the absorption region with InGaAsP and gradually reduce the "P" element (simultaneously the other elements In and Ga are also adjusted to stay lattice matched) to arrive at In(53%)Ga(47%)As. This approach creates a gradual level of the energy band-gap which may generate an internal potential which is desirable for the result seeked.

Such variations in the level of doping or composition, according to either one of the alternatives described above, may contribute to improving the performance of the device with a view of ensuring that the photo-generated electrons will reach the nearest collector layer. This is because such gradual p-doped section or a gradual material composition may contribute to generating an internal electric field so as to accelerate the photo-generated electrons to the nearest collector layer.

In the exemplary embodiment of FIGS. 2a and 2b, the first and second collectors 23 and 24 are respectively connected to n-type contact layers 25 and 26. It is to be noted however, the current generated by the diffusion of the electrons and arriving at one contact layer may be summed with the current generated by the diffusion of the electrons and arriving at the other contact layer. The p-type contact layer 21 maybe made at a location substantially in the middle of the absorption region 22 as shown in the FIGS. 2a and 2b. Therefore the photo-generated holes may be rapidly collected by the p-type contact layer 21 by dielectric relaxation mechanism.

According to further embodiments, the absorption region may include, in addition to p-doped sections as described in relation to FIGS. 2a and 2b, one or two depleted absorption regions in order to further improve the bandwidth-responsivity trade-off as previously explained in the known UTC structure of FIG. 1.

Figure 3:
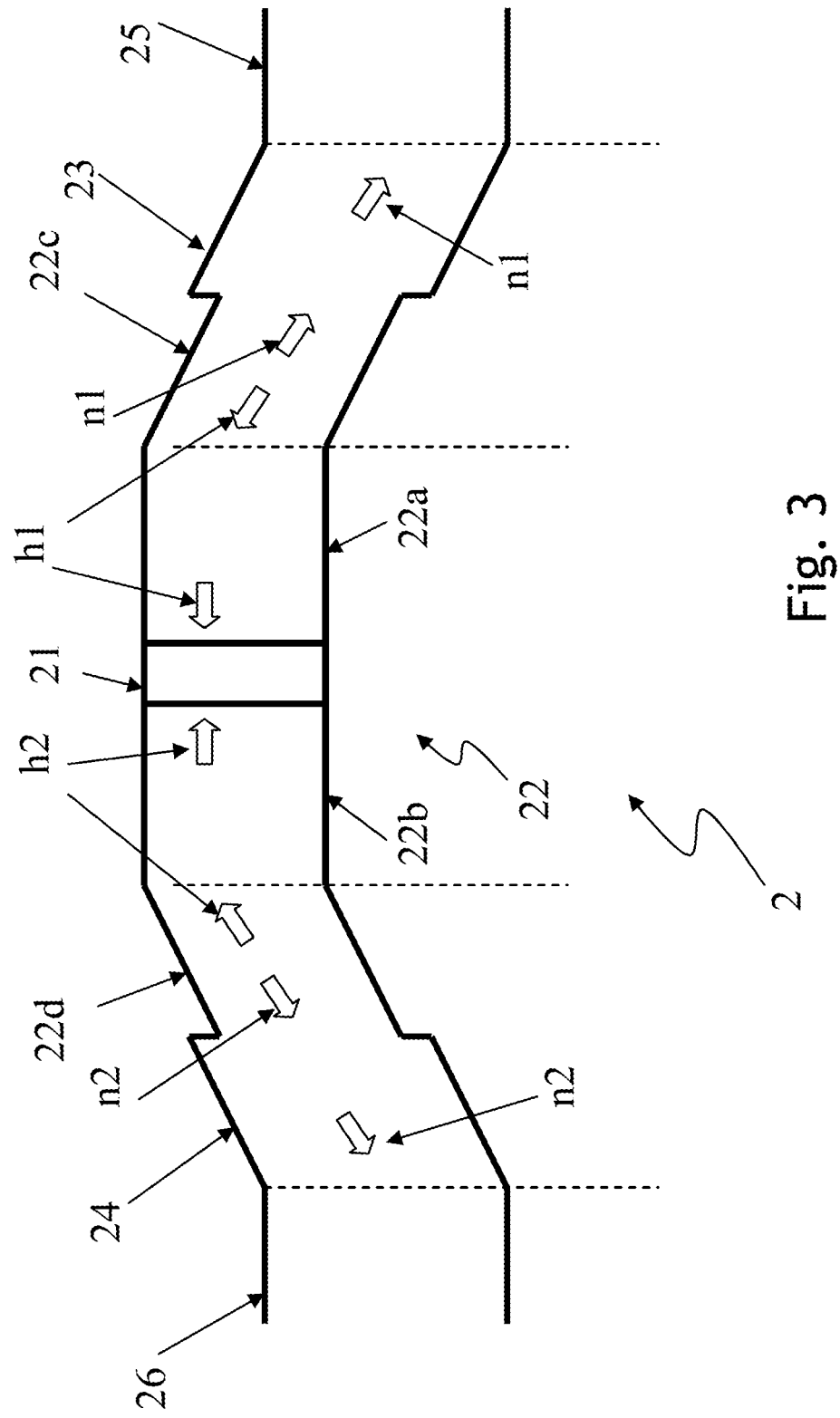
FIG. 3 is an exemplary schematic representation of an alternative band structure of a double UTC structure according to some embodiments.

FIG. 3 illustrates an example of a band structure of a double collector uni-travelling-carrier photodiode according to such embodiments. In FIG. 3, unless otherwise provided, like elements have been given like reference numerals as those of FIGS. 2a and 2b.

Therefore, similar to FIGS. 2a and 2b, the structure 2 of FIG. 3 comprises a p-type contact layer 21 and an absorption region 22 located between a first collector layer 23 and a second collector layer 24. The p-type contact layer 21 is located within the absorption region 22 and two sub-regions 22a and 22b of the absorption region 22 are shown on either side of the contact layer 21. The first and the second collector layers are preferably made of n-doped material. A first n-doped contact layer 25 and a second n-doped contact layer 26 are also shown which are preferably n-doped at a higher level than the level of doping of the first and second collector layers 23 and 24.

However, differently from the embodiments of FIGS. 2a and 2b, the absorption region 22 of the photodiode of FIG. 3, in addition to the first and second sub-regions 22a and 22b, is further provided with sections 22c and 22d that are depleted (i.e. undoped). Each of said depleted absorption sections 22c and 22d may give rise to the creation of a depletion region between the p-doped absorption region 22 (or sub-regions 22a and 22b) and the collector layers 23 and 24. Such depletion regions may contribute to further increasing the responsivity and/or the response time of the photodiode when appropriate reverse bias voltage is applied to the device.

In this manner, a new double collector uni-travelling-carrier photodiode is provided, as described in the various embodiments provided herein, that is capable of providing improved performance as regards bandwidth and responsivity compared to conventional uni-travelling-carrier photodiode structures. Such improvement in responsivity may allow for better levels of sensitivity as required for 100 G coherent optical communication systems.

The various embodiments of the present invention may be combined as long as such combination is compatible and/or complimentary.

Further it is to be noted that the list of structures corresponding to the claimed device is not exhaustive and that one skilled in the art understands that equivalent structures can be substituted for the recited structure without departing from the scope of the claimed invention.

It should be appreciated by those skilled in the art that any block diagrams herein represent conceptual views of illustrative circuitry embodying the principles of the invention.

The invention claimed is:

1. A uni-travelling carrier photodiode comprising;
   an absorption region of p-type doped material including a first p-doped sub-region, a second p-doped sub-region, the absorption region including variation in a level of doping or composition of the p-type doped material; and
   a first collector layer and a second collector layer, the absorption region being located between the first collector layer and the second collector layer, a first depleted section being located between the first sub-region and the first collector layer and a second depleted section being located between the second sub-region and the second collector layer.

2. The uni-travelling carrier photodiode of claim 1, wherein
   the absorption region is configured to generate electrons in response to an absorption of an incident light, and
   a number of the electrons diffuse toward the first collector layer and a different number of the electrons diffuse toward the second collector layer.

3. The uni-travelling carrier photodiode of claim 1, further comprising:
   a contact layer made of p-type material, said contact layer being located within the absorption region.

4. The uni-travelling carrier photodiode of claim 1, wherein the variation in the level of doping of the p-type doped includes a gradual p-doping configuration of said p-type doped material.

5. The uni-travelling carrier photodiode of claim 1, wherein the p-type doped material of the absorption region comprises a gradual composition of material having a uniform p-doping level.

6. An optical equipment comprising;
   a uni-travelling carrier photodiode including,
      an absorption region of p-type doped material including a first p-doped sub-region, a second p-doped sub-region, the absorption region including variation in a level of doping or composition of the p-type doped material; and
      a first collector layer and a second collector layer, the absorption region being located between the first collector layer and the second collector layer, a first depleted section being located between the first sub-region and the first collector layer and a second depleted section being located between the second sub-region and the second collector layer.

* * * * *